United States Patent
Marino et al.

(10) Patent No.: US 6,525,916 B2
(45) Date of Patent: Feb. 25, 2003

(54) ELECTRONIC DEVICE WITH DOUBLE-WIRE BONDING, MANUFACTURING METHOD THEREOF, AND METHOD FOR CHECKING INTACTNESS OF BONDING WIRES OF THIS ELECTRONIC DEVICE

(75) Inventors: Filippo Marino, Tremestieri Etneo (IT); Salvatore Capici, Barrafranca (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/747,172

(22) Filed: Dec. 21, 2000

(65) Prior Publication Data

US 2001/0019169 A1 Sep. 6, 2001

(30) Foreign Application Priority Data

Dec. 23, 1999 (IT) .......................... TO99A1148

(51) Int. Cl.[7] ................................ H02H 9/00
(52) U.S. Cl. ..................... 361/58; 361/100; 361/115
(58) Field of Search .......................... 361/58, 115, 78, 361/100, 42

(56) References Cited

U.S. PATENT DOCUMENTS 5,684,332 A * 11/1997 Chen et al. .................. 257/786
5,751,015 A * 5/1998 Corbett et al. ................. 257/48

* cited by examiner

*Primary Examiner*—Stephen W. Jackson
(74) *Attorney, Agent, or Firm*—Lisa K. Jorgenson; E. Russell Tarleton; Seed IP Law Group

(57) ABSTRACT

An electronic device having first and second external pins; first and second pads connected to the first external pin by respective bonding wires; and third and fourth pads connected to the second external pin respective bonding wires, and to a first common line by respective resistors. By means of a circuit configuration of this type, the intactness of the bonding wires can easily be checked by carrying out a simple resistance measurement between the first and the second external pin.

14 Claims, 2 Drawing Sheets

ELECTRONIC DEVICE WITH DOUBLE-WIRE BONDING, MANUFACTURING METHOD THEREOF, AND METHOD FOR CHECKING INTACTNESS OF BONDING WIRES OF THIS ELECTRONIC DEVICE

TECHNICAL FIELD

The present invention relates to an electronic device with double-wire bonding, a manufacturing method thereof, and a method for checking the intactness of the bonding wires of this electronic device.

BACKGROUND OF THE INVENTION

As is known, in electronic power devices, the connection between one or more of the contact pads of the die in which the device is provided and the respective pins of the lead frame to which the die is secured (typically by a bonding layer), is frequently obtained by double-wire bonding formed by two bonding wires that are typically made of gold and are arranged in parallel with one another.

The double-wire bonding is particularly useful in cases in which it is important to guarantee bonding having low resistivity during the conduction phase or a high current conduction capacity or both. In fact, for example, a single 2 mil gold wire cannot conduct a current greater than 2 A for an indefinite time, whereas if a second wire is added in parallel to the first, the current conduction capacity is in fact doubled.

In addition, in some applications, in order to reduce further the resistivity of the bonding during the conduction phase, and to increase further the current conduction capacity, use is also made of two pins of the lead frame, which have the same function, and are thus connected to one another outside the electronic device, and each have double-wire bonding to the respective pads.

In double-wire bonding, it is therefore necessary to ensure in a final test phase, that there is intactness and satisfactory bonding of all the bonding wires, by an automatic checking process, since, with the present technology, the bonding process has a defectiveness of approximately 50–100 ppm, and the intactness of the bonding wires is not guaranteed by the assembly operation, and the lack of one or more bonding wires could make the electronic power device unreliable.

The conventional measuring methods, such as pin to pin continuity measurements, require execution of operations that are somewhat complex, and particularly demanding in terms of testing time, in order to distinguish faulty bonding, in which a single bonding wire is present, from satisfactory bonding, in which both bonding wires are present, since the resistance of the gold wires is negligible compared with the overall resistance of the circuit being measured.

For example, a 2 mil gold wire 3 mm long has a resistance of 33 m$\Omega$, and on the assumption that a measurement is carried out with a current of 1 A, along the bonding wire there is consequently a voltage drop of 33 mV, which is approximately 100 times smaller than the voltage drop (approximately 3 V) on the diode (and on its internal resistor) which is typically arranged in series with the bonding wire.

Therefore, taking into account the dispersion of the values of the voltage drop on the diode, the voltage drop caused by the presence of a single bonding wire cannot be distinguished from that caused by the presence of two bonding wires.

A known solution used in order to overcome this problem consists of doubling the pad to which one end of the bonding wires is connected and the bonding wire, thus providing two separate pads which are connected to the same pin by different bonding wires.

This solution is shown schematically in FIGS. 1 and 2. In particular, FIG. 1 shows schematically an electronic device 1 comprising an output transistor, in the example an MOS transistor, one terminal of which is connected to a pad 3, which in turn is connected to a pin 4 via double-wire bonding indicated as 5a and 5b.

FIG. 2 shows schematically the same electronic device, in this case indicated as 8, as modified on the basis of the above-described known solution. In particular, in FIG. 2, the output transistor 2 is doubled into the output transistors 2a and 2b, the output terminals of which 6a, 6b are each connected to a corresponding pad 3a, 3b, into which the pad 3 has been doubled. The output transistors 2a and 2b have control terminals 7a, 7b, which are separated so that their operation can be controlled independently; the pin 4 is connected by the bonding wire 5a to the pad 3a, and by the bonding wire 5b to the pad 3b.

By means of this solution, by switching on separately the output transistor 2a or 2b, it is possible to check the correct bonding of the respective bonding wire 5a or 5b.

Although this solution makes it possible to check separately each bonding wire easily, by switching on separately each electronic component which is connected to the latter, it has the disadvantage that it requires an increase in the surface area occupied by the electronic device, due to the doubling of the electronic components that are connected at the output, and of the corresponding pads, as well as to the need to isolate electrically these doubled electronic components, and to the presence of additional electronic components for execution of the checking functions, which is highly undesirable in view of the continual trend towards ever-increasing miniaturization of integrated devices.

This disadvantage is all the more serious in cases in which, instead of having a single output electronic component to be doubled, there is a bridge configuration, in which all four of the electronic components of the bridge must be doubled.

This solution has the further disadvantage in that it involves a complication in the driving stage (not shown) of the electronic power device, which must be able to switch on separately each electronic component doubled, and that it requires introduction of a further command in order to activate the checking function and to select the final stage to be activated.

A solution proposed in order to eliminate the above-described disadvantages is described in European Patent EP-0622733 in the name of the applicant.

This solution does not require doubling of pads, and is based on the fact that, when a somewhat high current is passed through double-wire bonding, this gives rise to substantial dissipation of power by the bonding wires, and thus to heating of the latter, such that, since the resistance of gold wires is strongly dependent on the temperature, by monitoring the development over a period of time of the voltage drop caused by the current, it is possible to distinguish the double-wire bonding from that which is defective, in which only one of the bonding wires has been bonded correctly.

In fact, when the same current is supplied to the bonding wires, if there is a single bonding wire in tact, all of the current flows in this single bonding wire, thus generating dissipation of power which is four times greater than in the case of correct bonding, in which the current is distributed substantially equally between the two bonding wires.

As a result, in the case of incorrect bonding, there is greater heating of the bonding wire, a greater increase in its resistance, and thus a higher voltage drop, and therefore, when the development over a period of time of the voltage drop is compared with the corresponding development over a period of time for the same bonding in a part which is known to be intact, it is possible to detect any absence of a bonding wire.

However, practical implementation of this solution has the disadvantage that it requires firstly generation and control of relatively high currents, and secondly, use of highly sensitive measuring devices, since, in view of the resistance values of the gold wires concerned, the devices must be able to distinguish variations of voltage that are always very small, of approximately a few mV.

A solution proposed in order to eliminate the disadvantages inherent in the known art is described in patent application EP-74930, in the name of the applicant.

This solution involves doubling not only of the pad, but also of a section of the line which connects the pair of doubled pads electrically to a terminal of the electrical component, thus obtaining a pair of current paths arranged in parallel with one another, between the doubled pads and the terminal of the electronic component to which these pads are connected.

If a current is now supplied along the connection line, there is a voltage drop along the doubled sections of the connection line that are connected to intact bonding wires, but not along the doubled sections of the connection lines that are connected to bonding wires that are broken or not bonded.

By then measuring by means of comparators whether there is a difference of potential between the doubled contact pads, it is possible to determine any interruption of one or more bonding wires.

However, practical implementation of this solution on silicon has the disadvantage that it requires firstly the provision of precise rules of layout, to be followed in order to form the bonding, and secondly, additional circuitry, including the comparators, for recognition of the intactness of the bonding.

SUMMARY OF THE INVENTION

The embodiments of the present invention provide an electronic device with multiple-wire bonding, a manufacturing method thereof, and a method for checking the intactness of the bonding, which make it possible to eliminate the above-described disadvantages of the known art, by minimizing the complexities of the circuitry, both from the point of view of the circuits that are necessary in order to recognize the intactness of the bonding, and from the point of view of driving of these circuits, and, at the same time, by making it possible to provide a simple and reliable final test phase.

According to the present invention, an electronic device is provided that includes a first and at least a second external pin; a first, a second, and at least a third pad; a first bonding wire connecting the first pad to the first external pin; a second bonding wire connecting the second pad to the first external pin; a third bonding wire connecting the third pad to the third external pin; and a first and at least a second component having respectively a first and a second electrical impedance, and having first terminals connected respectively to the first and second pad and second terminals connected to a first node, the first node also being connected to the third pad.

According to the present invention, a method for manufacturing an electronic device is also provided that includes providing a first and at least a second external pin; providing a first, a second, and at least a third pad; bonding a first bonding wire between the first pad and the first external pin, a second bonding wire between the second pad and the first external pin, and a third bonding wire between the third pad and the second external pin; providing a first and at least a second component having respectively a first and a second electrical impedance; connecting first terminals of the first and second component respectively to the first and second pad, and second terminals of the first and second component to a first node; and connecting the third pad to the first node.

Finally, according to the present invention, a method for checking intactness of bonding wires of an electronic device is provided, the device having a first and at least a second external pin; a first, a second, and at least a third pad; a first bonding wire connecting the first pad to the first external pin; a second bonding wire connecting the second pad to the first external pin; a third bonding wire connecting the third pad to the second external pin; and a first and at least a second component having respectively a first and a second electrical impedance, and having first terminals connected respectively to the first and to the second pads, and second terminals connected to a first node, the first node also being connected to the third pad, the method including carrying out at least one impedance measurement between the first and the second external pins. Ideally, the method includes comparing the measurement to a predetermined value to determine the intactness of the bonding wires.

BRIEF DESCRIPTION OF THE DRAWINGS

In order to assist in the understanding of the present invention, a preferred embodiment is now described, purely by way of non-limiting example, and with reference to the attached drawings, in which.

DETAILED DESCRIPTION OF THE INVENTION

Figure 1:
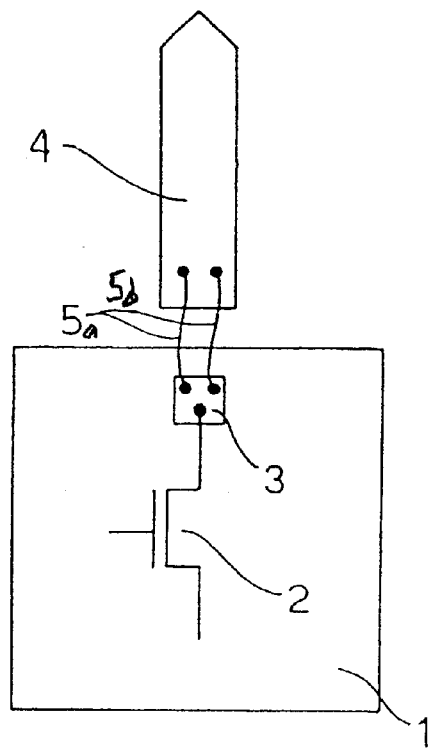
FIG. 1 shows a first known electronic power device, with multiple-wire bonding.
Figure 2:
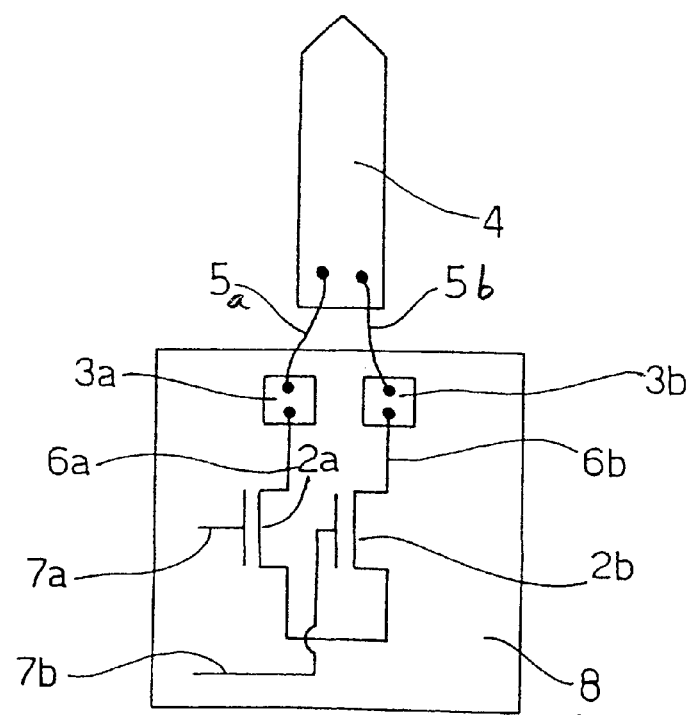
FIG. 2 shows a second known electronic power device, with multiple-wire bonding.
Figure 3:
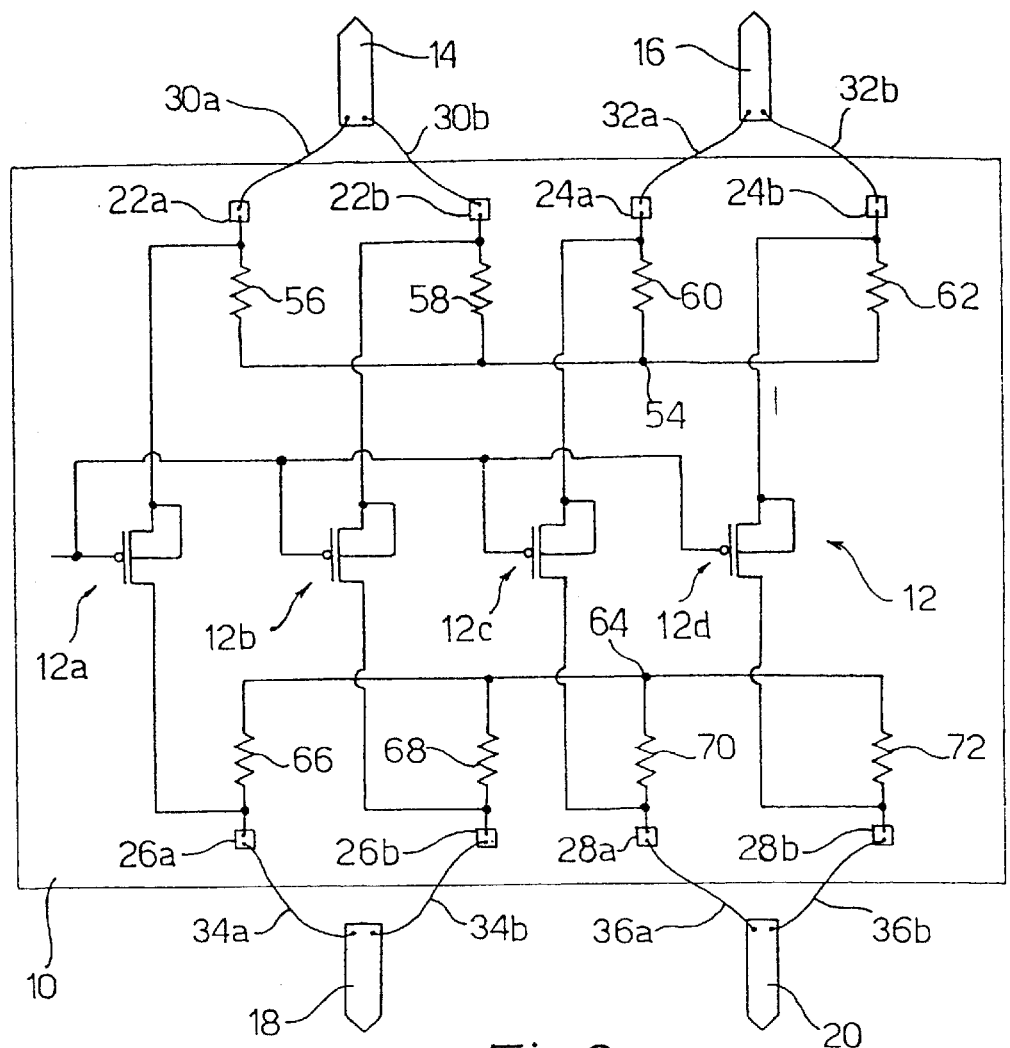
FIG. 3 shows an electronic power device with multiple-wire bonding produced according to the present invention.

An electronic device 10 according to an embodiment of the present invention, is shown in FIG. 3, of which the intactness of the bonding between pads and pins is to be checked, and of which only the parts that are useful for understanding the present invention are shown.

In particular, FIG. 3 shows an embodiment in which the electronic device 10 comprises an output power transistor 12, in the example illustrated of the PMOS type, having a source terminal connected to a first pair of pins, 14, 16 of the lead frame (not shown), and a drain terminal connected to a second pair of pins 18, 20.

In particular, the bonding of the power transistor 12 to the pins 14–20 is of the double-wire type, such as to guarantee low resistivity during the conduction phase, and a high conduction capacity for high currents, as previously described. In addition, the pins 14, 16 of the first pair carry out the same function in use, i.e., they are the pins to which the source terminal of the power transistor 12 is connected, and they are therefore connected to one another outside the lead frame, just as the pins 18, 20 of the second pair carry out the same function in use, i.e., they are the pins to which the drain terminal of the power transistor 12 is connected, and they are therefore connected to one another outside the lead frame.

In the example in FIG. 3, each of the four pins 14–20 of the lead frame is connected to a respective pair of pads, indicated respectively as 22a, 22b, 24a, 24b, 26a, 26b, 28a, 28b, by respective double-wire bonding, formed by two gold wires, indicated respectively as 30a, 30b, 32a, 32b, 34a, 34b, 36a, 36b, which are arranged in parallel with one another, and are bonded to the pins and to the pads.

In addition, the power transistor 12 is designed such as to have a number of independent pairs of source and drain regions, which is equivalent to the number of double-wire bonds used, i.e., which is equivalent to the number of pairs of pads used, and for this purpose it is sufficient to design appropriately the metal interconnection levels.

In particular, the power transistor 12 comprises four power transistors 12a, 12b, 12c and 12d having gate terminals connected to one another and receiving a single command signal, source terminals connected respectively to the pads 22a, 24a, 26a and 28a, drain terminals connected respectively to the pads 22b, 24b, 26b and 28b, and bulk terminals connected to the respective source terminals.

Figure 4:
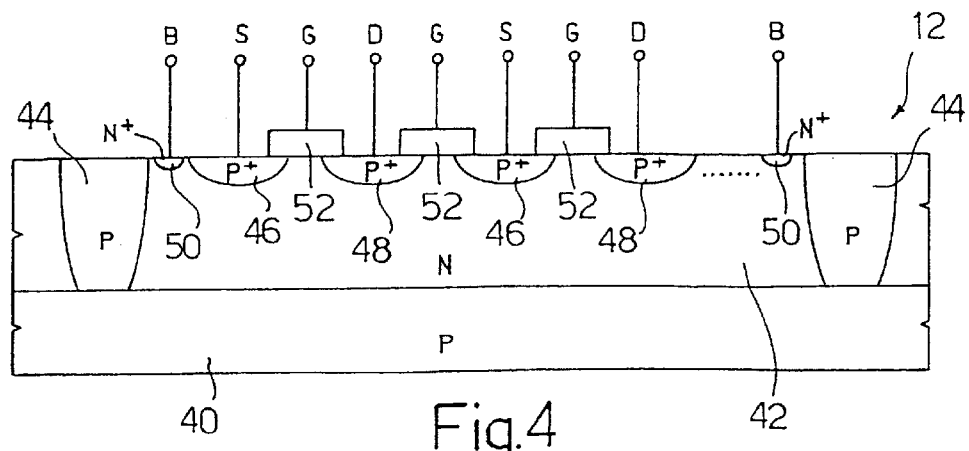
FIG. 4 shows a schematic transverse cross-section of a semiconductor material body in which a power transistor with independent source and drain regions is formed.

FIG. 4 shows a schematic transverse cross-section of a semiconductor material body in which a CMOS power transistor of the above-described type is formed, in which 40 indicates the substrate of type P, 42 indicates the well of type N which is obtained by epitaxial growth on the substrate 40, which defines the bulk region (or body) of the power transistor 12 and which is delimited laterally by two insulating wells 44 of type P, 46 and 48 indicate the diffuse source and drain regions of type P$^+$, 50 indicates the low resistivity regions of type N$^+$ for biasing of the bulk region 42, reference number 52 indicates the gate oxide, and S, D and G indicate the source, drain and gate terminals, respectively, of the power terminal 12, which are connected to the source and drain regions and to the gate oxide, respectively.

As can be seen, the power transistor 12 has a distributed structure formed by a succession of source and drain regions contained in the epitaxial well which forms the bulk region.

In conventional CMOS power transistors, all the diffuse source regions and all the diffuse drain regions are then contacted and connected to one another by means of metal, such as to form respectively a single source terminal and a single drain terminal, whereas for implementation of the present invention, the diffuse source and drain regions are contacted, but are not connected to one another, such as to be independent from one another, and such that they can be connected individually to the pads of the electronic power device.

In power transistors manufactured using technologies other than the CMOS type concerned, for example Vertical DMOS transistors or Lateral DMOS transistors, separation of the source regions and drain regions could require formation of further insulation regions, as well as planning of the metal interconnection levels.

According to the invention, the pads 22a, 22b, 24a and 24b to which the source terminals of the power transistors 12a–12d are connected, are connected to a first common line, via corresponding resistors 56, 58, 60, 62 having resistances R1, R2, R3 and R4 respectively, whereas the pads 26a, 26b, 28a and 28b, to which the drain terminals of the power transistors 12a–12d are connected, are in turn connected to a second common line 64 via respective resistors 66, 68, 70 and 72 that have resistances R5, R6, R7 and R8 respectively.

By means of a structure of this type, the lack of intactness of one or more of the bonding wires 30–36 can be determined during the final test phase by means of a simple resistance measurement.

In fact, if measurement is made of the equivalent resistance $R_{EQ1}$ present between the pins 14 and 16, with the power transistors 12a–12d switched off and the bonding wires 30, 32 intact, this resistance will be equivalent to:

$$R_{EQ1} = \frac{R1 \cdot R2}{R1 + R2} + \frac{R3 \cdot R4}{R3 + R4}$$

whereas if the equivalent resistance $R_{EQ2}$ present between the pins 18 and 20 is measured, with the power transistors 12a–12d switched off and the bonding wires 34, 36 intact, this will definitely be equivalent to:

$$R_{EQ2} = \frac{R5 \cdot R6}{R5 + R6} + \frac{R7 \cdot R8}{R7 + R8}$$

It can easily be deduced that if at least one of the bonding wires 30–36 is not bonded, the equivalent resistance measured between the pins 14 and 16 or between the pins 18 and 20, will have a value different from that which can be calculated by the preceding formulas.

For example, if the bonding wire 30b were not bonded, the equivalent resistance measured between the pins 14 and 16 would be equivalent to:

$$R_{EQ1} = R2 + \frac{R3 \cdot R4}{R3 + R4}$$

and therefore, if the resistances R1–R4 were all equal, and had a value such as to be able to leave out of account the resistance of the bonding wires 30, 32, for example 100 Ω, the equivalent resistance measured would be 150 Ω instead of 100 Ω, as in the case of intact double-wire bonding.

The advantages which the electronic device according to the present invention makes it possible to obtain, are apparent from examination of its characteristics.

In particular, the present invention makes it possible to show clearly any interruptions on the bonding wires, using a solution which is low cost in terms of occupation of area on silicon, since it is necessary simply to design the power transistor in the manner previously described, whereas it is not necessary to duplicate or multiply components connected to the exterior and their control circuits, in terms of test time, since it is necessary to carry out only one resistance measurement, and also in terms of structures to be added in order to carry out the test, since it is sufficient to add only resistors to the electronic device.

Finally, it is apparent that modifications and variants can be made to the electronic device described and illustrated herein, without departing from the protective context of the claims that follow and the equivalents thereof.

In particular, the present invention is applicable in all cases in which there are present at least two pins of the lead frame, which have the same function (pins 14 and 16 or pins 18 and 20), at least one of which is provided with double-wire bonding. In fact, if none of the pins having the same function is provided with double-wire bonding, it is not necessary to connect resistors in series to these pins, since the lack of bonding can be detected immediately by means of conventional measurement of continuity or of isolation.

In general, in fact, for each of the pins provided with double-wire bonding, it is sufficient to provide a pair of resistors connected between the two bonding wires and the respective common line, whereas for each of the pins provided with single-wire bonding and having the same function as the pins provided with double-wire bonding, it is not necessary to provide any resistor between the bonding wire and the respective common line, since these can then be connected directly to one another.

For example, if the pin 14 is the only pin provided with double-wire bonding, it is sufficient to place the resistors 56 and 58 alone in series with the bonding wires 30a and 30b, whereas the pad 24a or 24b can be connected directly to the first common line 54.

In addition, the present invention is applicable not only to double-wire bonding, i.e., in which a pair of pads is associated with each pin, but more generally to any multiple-wire bonding, i.e., in which more than two pads are associated with each pin. In fact, in this situation, it is sufficient to connect a resistor between each of the pads and the respective common line and to evaluate the effect of lack of intactness of a bonding wire on the resistance measured between a pair of pins. In addition, each pad could be connected to the respective pin by means of more than one bonding wire.

Furthermore, the resistors connected between the pads and the respective common lines could be replaced by any other type of electronic component having its own electrical impedance, for example a capacitor, and in this case the check on the intactness of the bonding wires would be transformed from a resistance measurement into an impedance measurement.

Finally, the electronic component which is connected to the pins 14–20 of the lead frame need not necessarily be a power transistor, but could be any other electronic component which can be sub-divided in a manner similar to that described for the power transistor 12. For example, the electronic component could be a resistor, which, in the example shown in FIG. 3, can be sub-divided into four resistors that can be connected in parallel with one another, in a manner similar to that described in the power transistor 12, and the equivalent resistance of which is equal to the resistance of the original resistor. In this case, depending on the bonding of the other pins 18 and 20, the resistance measurement carried out for example between the pins 14 and 16 may or may not be affected by these resistors, and in the determination of any interruption of one or more bonding wires, it is also necessary to take into account the contribution made by these resistors, which must obviously be known, or at least quantifiable.

What is claimed is:

1. An electronic device comprising a first and at least a second external pin; a first, a second and at least a third pad; a first bonding wire connecting said first pad to said first external pin; a second bonding wire connecting said second pad to said first external pin; a third bonding wire connecting said third pad to said second external pin; and a first and at least a second resistive component having respectively a first and a second electrical impedance, and having first terminals connected respectively to said first and said second pad and second terminals connected to a first node, said first node also being connected to said third pad to enable measurement of resistance between the first and at least the second external pin; and further comprising a fourth pad; a fourth bonding wire connecting said fourth pad to said second external pin; and a third and at least a fourth component having respectively a third and a fourth electrical impedance, and having first terminals connected respectively to said third and said fourth pad, and second terminals connected to said first node.

2. An electronic device comprising a first and at least a second external pin; a first, a second and at least a third pad; a first bonding wire connecting said first pad to said first external pin; a second bonding wire connecting said second pad to said first external pin; a third bonding wire connecting said third pad to said second external pin; and a first and at least a second resistive component having respectively a first and a second electrical impedance, and having first terminals connected respectively to said first and said second pad and second terminals connected to a first node, said first node also being connected to said third pad to enable measurement of resistance between the first and at least the second external pin; and further comprising a third and at least a fourth external pin; a fifth, a sixth and at least a seventh pad; a fifth bonding wire connecting said fifth pad to said third external pin; a sixth bonding wire connecting said sixth pad to said third external pin; a seventh bonding wire connecting said seventh pad to said fourth external pin; and a fifth and at least a sixth resistive component having respectively a fifth and a sixth electrical impedance, and having first terminals connected respectively to said fifth and to said sixth pad, and second terminals connected to a second node, said second node also being connected to said seventh pad to enable measurement of resistance between the third and at least the fourth external pin.

3. The electronic device of claim 2, further comprising an eighth pad; an eighth bonding wire, connecting said eighth pad to said fourth external pin; and a seventh and at least an eighth resistive component having respectively a seventh and an eighth electrical impedance, and having first terminals connected respectively to said seventh and to said eighth pad, and second terminals connected to said second node.

4. An electronic device comprising a first and at least a second external pin; a first, a second and at least a third pad; a first bonding wire connecting said first pad to said first external pin; a second bonding wire connecting said second pad to said first external pin; a third bonding wire connecting said third pad to said second external pin; and a first and at least a second resistive component having respectively a first and a second electrical impedance, and having first terminals connected respectively to said first and said second pad and second terminals connected to a first node, said first node also being connected to said third pad to enable measurement of resistance between the first and at least the second external pin, and wherein said resistive components comprise resistors, each having a respective electrical resistance.

5. An electronic device comprising a first and at least a second external pin; a first, a second and at least a third pad; a first bonding wire connecting said first pad to said first external pin; a second bonding wire connecting said second pad to said first external pin; a third bonding wire connecting said third pad to said second external pin; and a first and at least a second resistive component having respectively a first and a second electrical impedance, and having first terminals connected respectively to said first and said second pad and second terminals connected to a first node, said first node also being connected to said third pad to enable measurement of resistance between the first and at least the second external pin; and further comprising a transistor having a number of first independent conductivity regions equivalent to the number of said pads connected to said first node, each of said first conductivity regions connected to a respective one of said pads connected to said first node.

6. The electronic device of claim 3, further comprising a transistor having a number of first independent conductivity regions equivalent to the number of said pads connected to said first node, and a number of second independent conductivity regions equivalent to the number of said pads connected to said second node, each of said first conductivity regions connected to a respective one of said pads connected to said first node, and each of said second conductivity regions connected to a respective one of said pads connected to said second node, the transistor configured to couple the pads connected to the first node to the pads connected to the second node when switched on.

7. An electronic device, comprising:
   an electrical component subdivided into at least four identical components, each identical component having first and second terminals;
   a first pin and second pin associated with the first terminals and a third pin and fourth pin associated with the second terminals;
   a first pair of bonding pads, each coupled to the respective first terminal of the electronic component and further coupled to the first pin by a respective bonding wire;
   a second pair of bonding pads, each coupled to the first terminal of the at least two identical components and further coupled to the second pin by a respective bonding wire;
   a third pair of bonding pads, each coupled to the second terminal of the electronic component and further coupled o the third pin by a respective bonding wire;
   a fourth pair of bonding pads, each coupled to the second terminal of the electronic component and further coupled to the fourth pin by a respective bonding wire;
   a first and second pair of resistive elements, each resistive element having a first terminal coupled to a respective bonding pad of the first and second pair of bonding pads and a second terminal coupled to a first common line; and
   a third and fourth pair of resistive elements, each resistive element having a first terminal coupled to the respective bonding pad of the third and fourth pair of bonding pads and a second terminal coupled to a second common line.

8. An electronic device, comprising:
   four pins, each of the four pins connected to a respective pair of bonding pads by a respective double-wire bonding arranged in parallel with one another and bonded to the pins and to the pads;
   an output power transistor circuit comprising four identical transistors, each transistor having a source terminal connected to each of the bonding pads associated with one of the first and second pins respectively and a drain terminal connected to each of the bonding pads associated with the third and fourth pins, respectively;
   a first and second pair of resistive elements, each resistive element having a first terminal coupled to the respective bonding pad to the first and second pins and a second terminal coupled to a first common line; and
   a third and a fourth pair of resistive elements, each resistive element having a first terminal coupled to the respective bonding pad of the third and fourth pins, and a second terminal coupled to a second common line;
   the output power transistor configured to couple the pads connected tot eh first and second pins to the pads connected to the third and fourth pins when switched on and to uncouple the pads when switched off to enable measurement of resistance between pins connected to the first common line and between pins connected to the second common line via their respective resistive elements.

9. An electronic device comprising a first and at least a second external pin; a first, a second and at least a third pad; a first bonding wire connecting said first pad to said first external pin; a second bonding wire connecting said second pad to said first external pin; a third bonding wire connecting said third pad to said second external pin; and a first and at least a second resistive component having respectively a first and a second electrical impedance, and having first terminals connected respectively to said first and said second pad and second terminals connected to a first node, said first node also being connected to said third pad to enable measurement of impedance between the first and at least the second external pin; and further comprising a fourth pad; a fourth bonding wire connecting said fourth pad to said second external pin; and a third and at least a fourth component having respectively a third and a fourth electrical impedance, and having first terminals connected respectively to said third and said fourth pad, and second terminals connected to said first node.

10. An electronic device comprising a first and at least a second external pin; a first, a second and at least a third pad; a first bonding wire connecting said first pad to said first external pin; a second bonding wire connecting said second pad to said first external pin; a third bonding wire connecting said third pad to said second external pin; and a first and at least a second resistive component having respectively a first and a second electrical impedance, and having first terminals connected respectively to said first and said second pad and second terminals connected to a first node, said first node also being connected to said third pad to enable measurement of impedance between the first and at least the second external pin; and further comprising a third and at least a fourth external pin; a fifth, a sixth and at least a seventh pad; a fifth bonding wire connecting said fifth pad to said third external pin; a sixth bonding wire connecting said sixth pad to said third external pin; a seventh bonding wire connecting said seventh pad to said fourth external pin; and a fifth and at least a sixth component having respectively a fifth and a sixth electrical impedance, and having first terminals connected respectively to said fifth and to said sixth pad, and second terminals connected to a second node, said second node also being connected to said seventh pad to enable measurement of impedance between the third and at least the fourth external pin.

11. The electronic device of claim 10, further comprising an eighth pad; an eighth bonding wire, connecting said eighth pad to said fourth external pin; and a seventh and at least an eighth component having respectively a seventh and an eighth electrical impedance, and having first terminals connected respectively to said seventh and to said eighth pad, and second terminals connected to said second node.

12. An electronic device comprising a first and at least a second external pin; a first, a second and at least a third pad; a first bonding wire connecting said first pad to said first external pin; a second bonding wire connecting said second pad to said first external pin; a third bonding wire connecting said third pad to said second external pin; and a first and at least a second component having respectively a first and a second electrical impedance, and having first terminals connected respectively to said first and said second pad and second terminals connected to a first node, said first node also being connected to said third pad to enable measurement of impedance between the first and at least the second external pin; and wherein said components comprise resistors, each having a respective electrical resistance.

13. An electronic device comprising a first and at least a second external pin; a first, a second and at least a third pad; a first bonding wire connecting said first pad to said first external pin; a second bonding wire connecting said second pad to said first external pin; a third bonding wire connecting said third pad to said second external pin; and a first and at least a second component having respectively a first and a second electrical impedance, and having first terminals connected respectively to said first and said second pad and second terminals connected to a first node, said first node also being connected to said third pad to enable measurement of impedance between the first and at least the second external pin; and further comprising a transistor having a number of first independent conductivity regions equivalent to the number of said pads connected to said first node, each of said first conductivity regions connected to a respective one of said pads connected to said first node.

14. The electronic device of claim 11, further comprising a transistor having a number of first independent conductivity regions equivalent to the number of said pads connected to said first node, and a number of second independent conductivity regions equivalent to the number of said pads connected to said second node, each of said first conductivity regions connected to a respective one of said pads connected to said first node, and each of said second conductivity regions connected to a respective one of said pads connected to said second node, the transistor configured to couple the pads connected to the first node to the pads connected to the second node when switched on.

* * * * *

UNITED STATES PATENT AND TRADEMARK OFFICE
CERTIFICATE OF CORRECTION

PATENT NO.    : 6,525,916 B2
DATED         : February 25, 2003
INVENTOR(S)   : Filippo Marino et al.

It is certified that error appears in the above-identified patent and that said Letters Patent is hereby corrected as shown below:

Column 8,
Line 5, "a fourth component" should read as -- a fourth resistive component --.

Signed and Sealed this

Twenty-second Day of April, 2003

JAMES E. ROGAN
*Director of the United States Patent and Trademark Office*